(12) United States Patent
Wu et al.

(10) Patent No.: US 7,542,793 B2
(45) Date of Patent: Jun. 2, 2009

(54) MR-GUIDED BREAST TUMOR ABLATION AND TEMPERATURE IMAGING SYSTEM

(75) Inventors: Tao Wu, Rochester, MN (US); Joel P. Felmlee, Rochester, MN (US)

(73) Assignee: Mayo Foundation For Medical Education and Research, Rochester, MN (US)

( * ) Notice: Subject to any disclaimer, the term of this patent is extended or adjusted under 35 U.S.C. 154(b) by 1380 days.

(21) Appl. No.: 10/225,915

(22) Filed: Aug. 22, 2002

(65) Prior Publication Data

US 2004/0039280 A1    Feb. 26, 2004

(51) Int. Cl.
*A61B 5/00* (2006.01)
(52) U.S. Cl. .................. 600/412; 600/411; 600/419; 600/420; 324/300; 324/315
(58) Field of Classification Search ........... 600/407, 600/410–412, 549, 555, 419, 420; 335/37; 324/300, 315
See application file for complete search history.

(56) References Cited

U.S. PATENT DOCUMENTS

| | | | | |
|---|---|---|---|---|
| 4,554,925 A | * | 11/1985 | Young | .................. 600/411 |
| 4,558,279 A | | 12/1985 | Ackerman et al. | |
| 4,914,608 A | | 4/1990 | LeBihan et al. | |
| 5,049,820 A | * | 9/1991 | Briand et al. | .................. 324/309 |
| 5,207,222 A | * | 5/1993 | Koizumi et al. | .................. 600/412 |
| 5,263,482 A | * | 11/1993 | Leunbach | .................. 600/412 |
| 5,270,654 A | * | 12/1993 | Feinberg et al. | .................. 324/309 |
| 5,327,884 A | | 7/1994 | Hardy et al. | |
| 5,378,987 A | | 1/1995 | Ishihara et al. | |
| RE35,656 E | * | 11/1997 | Feinberg et al. | .................. 324/309 |
| 5,706,810 A | * | 1/1998 | Rubinsky et al. | .................. 600/412 |
| 5,711,300 A | | 1/1998 | Schneider et al. | |
| 5,749,834 A | * | 5/1998 | Hushek | .................. 600/410 |
| 5,916,161 A | | 6/1999 | Ishihara et al. | |
| 6,032,068 A | | 2/2000 | Daniel et al. | |
| 6,058,323 A | * | 5/2000 | Lemelson | .................. 600/408 |
| 6,064,206 A | * | 5/2000 | Van Vaals et al. | .................. 324/312 |
| 6,088,613 A | * | 7/2000 | Unger | .................. 600/420 |

(Continued)

FOREIGN PATENT DOCUMENTS

DE    19907137 A  *  2/1997

(Continued)

OTHER PUBLICATIONS

Feinberg et al., "Tissue Perfusion in Humans Studied by Fourier Velocity distribution, lines scan, and echo-planar imaging.", Tissue Magn Reson Med. Nov. 1990;16(2)280-93.*

*Primary Examiner*—Long V Le
*Assistant Examiner*—Ellsworth Weatherby
(74) *Attorney, Agent, or Firm*—Quarles & Brady LLP

(57) ABSTRACT

An MRI system is employed to aim an ultrasonic transducer at tissues to be treated and to produce images which enable the treatment of the tissues to be monitored. A pulse sequence is used which produces both a spin-echo NMR signal and a gradient-echo NMR signal and changes in phase between these two signals is measured and used to produce a temperature map. Changes in amplitude of the spin-echo NMR signal from a reference spin-echo NMR signal is used to produce images which indicate temperature changes in both fat and water. These temperature maps may be used to aim the heat treatment device.

19 Claims, 4 Drawing Sheets

U.S. PATENT DOCUMENTS

| | | | |
|---|---|---|---|
| 6,194,899 B1 * | 2/2001 | Ishihara et al. | 324/315 |
| 6,377,834 B1 * | 4/2002 | Zhou et al. | 600/412 |
| 6,445,183 B1 * | 9/2002 | Shimizu et al. | 324/309 |
| 6,615,069 B1 * | 9/2003 | Komura et al. | 600/412 |
| 6,618,608 B1 * | 9/2003 | Watkins et al. | 600/412 |
| 6,768,917 B1 * | 7/2004 | Van Vaals | 600/424 |
| 2004/0015071 A1 * | 1/2004 | Komura et al. | 600/410 |

FOREIGN PATENT DOCUMENTS

| | | | |
|---|---|---|---|
| DE | 19631916 A | * | 9/1999 |
| JP | 2000166892 A | * | 6/2000 |

* cited by examiner

MR-GUIDED BREAST TUMOR ABLATION AND TEMPERATURE IMAGING SYSTEM

BACKGROUND OF THE INVENTION

The field of the invention is nuclear magnetic resonance imaging methods and systems. More particularly, the invention relates to the in vivo measurement of the effect of thermal treatment on tissue.

MR-guided interventional procedures employ an MRI system to monitor the medical treatment procedure. Such medical treatment procedures include MR-guided biopsies, hyperthermia, cyroablation, and thermal ablation using laser, radiofrequency, and focused ultrasound. Images produced by the MRI system depict the anatomy being treated and the medical instrument used to perform the treatment. These anatomic images are produced in real-time as treatment is performed and they assist the physician in physically guiding the instrument into proper position.

With medical procedures that thermally treat or ablate tissues, the MRI system can also produce images that indicate the temperature of tissues, within their field of view. Such temperature maps indicate the location of heating and the amount of heating that has occurred in the target tissues and surrounding tissues. The physician uses this information to properly direct the heat produced by the medical instrument and to terminate the treatment at the proper moment. An exemplary MRI temperature mapping method is disclosed in U.S. Pat. No. 5,711,300.

Magnetic resonance guided high intensity focused ultrasound (FUS) ablation is an attractive non-invasive method to selectively ablate deep-lying tissue where bone and air are not present in the ultrasound acoustic path. The therapeutic value of this alternative surgical technique depends on the accuracy of the MR temperature imaging method. There are several MR imaging techniques for measuring temperature change: T1-weighted imaging, diffusion imaging, and water proton resonance frequency (WPRF) imaging. Among these different temperature-imaging methods, WPRF temperature imaging is the preferred technique for FUS ablation therapy. In WPRF temperature imaging, temperature changes are calculated from phase difference images, usually acquired using a fast gradient echo sequence performed before and after FUS sonication. Several studies have demonstrated that WPRF temperature imaging can be used to accurately monitor temperature change in in vivo muscle tissue during FUS ablation treatment.

While in general the WPRF temperature imaging technique has many advantages over other methods, it has limitations in certain clinical applications. The WPRF technique measures temperature change by sensing the temperature-dependency of the hydrogen proton in water molecules. The resonance frequency of hydrogen protons in fat tissue, however, does not exhibit the same temperature sensitivity as in water. Therefore, in anatomical regions with low water content but high fat content (e.g. the human breast) WPRF cannot reliably provide adequate temperature monitoring for FUS treatment. In fact, this limitation has posed great difficulty for MR guided FUS ablation for breast cancer treatment. While WPRF imaging may be successfully used to monitor temperature change in a tumor, the WPRF technique does not indicate temperature increase in surrounding fat. The practical result is that it is very difficult to aim the FUS ablation device because the resulting temperature rise at its focal point is not apparent when the tissues are primarily fat and the tumor(s) is very small.

Another limitation of the WPRF temperature imaging method is that the measured temperature is a relative temperature change which occurs during two independent image acquisitions. These acquisitions are usually performed before and after FUS sonication. The tissue temperature is then inferred from this temperature change assuming that the base temperature, which is acquired before FUS sonication, is a constant temperature throughout the ablation procedure. This assumption, however, is not true during the course of an ablation treatment, especially at the later part of the treatment when the tissue temperature in the surrounding volume of the tumor has been elevated due to FUS near field heat accumulation. Consequently, temperature measured from WPRF imaging may underestimate the actual temperature in tissue/tumor, and this potentially may cause injury to the surrounding healthy tissues.

SUMMARY OF THE INVENTION

The present invention is a method for monitoring the effects of a thermal treatment procedure with an MRI system by measuring the phase shift that occurs between a spin-echo NMR signal and a gradient-echo NMR signal produced by a single pulse sequence. More specifically, a pulse sequence is performed by the MRI system in which both a spin-echo (SPE) NMR signal and a gradient-echo (GRE) NMR signal are acquired; an SPE phase image is reconstructed from the acquired SPE NMR signals; a GRE phase image is reconstructed from the acquired GRE NMR signals; and a phase difference temperature map is produced by calculating the phase difference at corresponding locations in the SPE and GRE phase images.

An object of the invention is to produce a temperature map which indicates temperature change from a reference temperature in the subject before a medical procedure is begun. This is achieved by producing a reference phase difference image from SPE and GRE NMR signals acquired before the procedure is begun. This reference image is subtracted from phase difference images produced during the procedure.

Another object of the invention is to provide a temperature map which aids in the aiming of a treatment device. A second temperature map is produced by reconstructing modulus images from the SPE NMR signals. This modulus temperature map indicates temperature changes in both fat and water spins based on the $T_1$ relaxation rate change caused by heat, thus enabling the focal point of a FUS ablation device to be seen in fatty tissues such as the human breast.

Yet another object of the invention is to provide a temperature map over a limited field of view. The SPE and GRE signals are produced by transverse magnetization that is generated with a selective RF excitation pulse followed by a selective RF refocusing pulse. The slice select magnetic field gradient produced during the RF excitation pulse selects a 2D slice through the tissues being treated and a perpendicular slab select magnetic field gradient produced during the RF refocusing pulse selects a limited field of view in this slice in the phase encoding direction. As a result, the field of view of the resulting temperature map can be limited in size in the phase encoding direction without producing artifacts which are aliased into the field of view.

The foregoing and other objects and advantages of the invention will appear from the following description. In the description, reference is made to the accompanying drawings which form a part hereof, and in which there is shown by way of illustration, a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
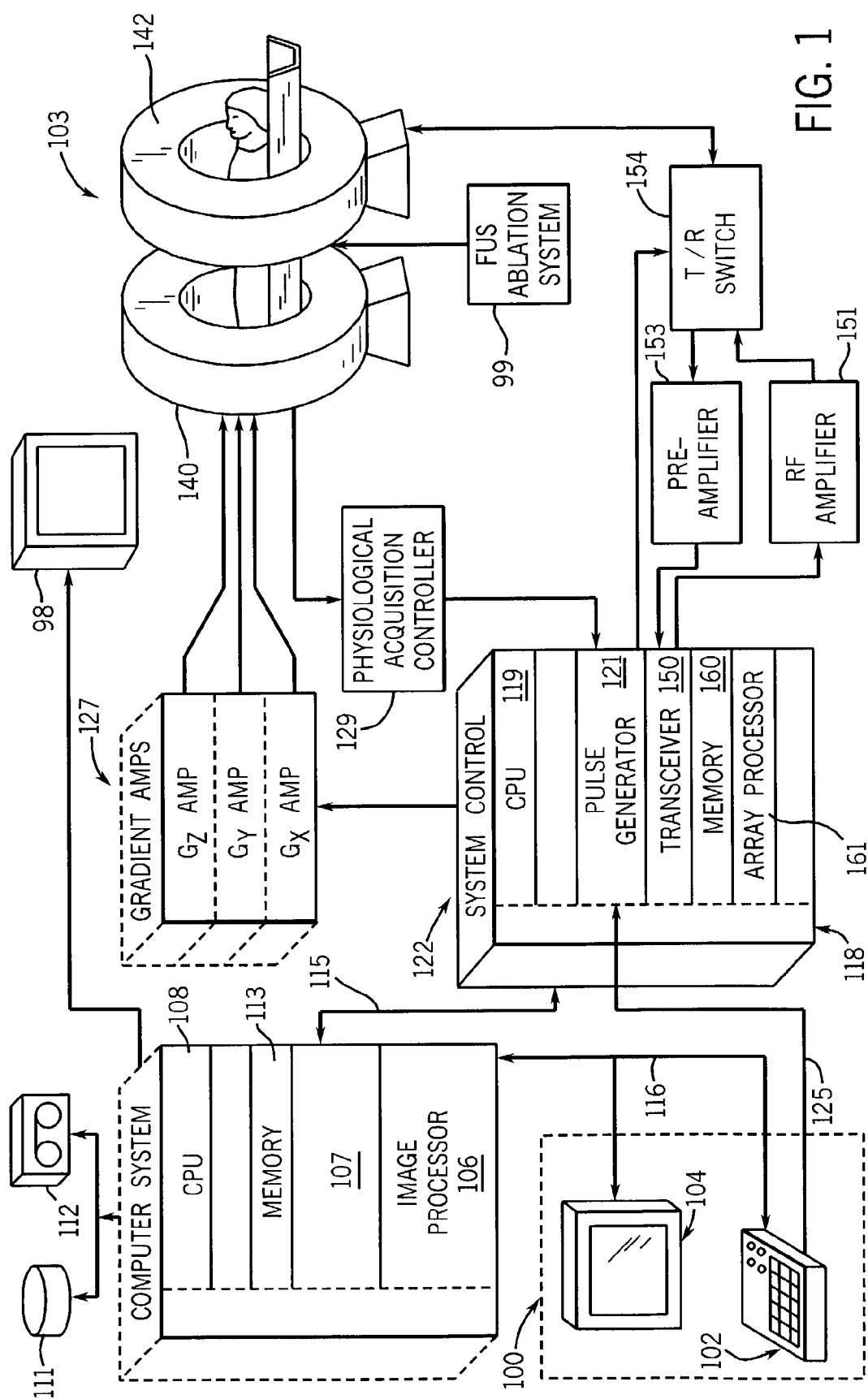
FIG. 1 is a block diagram of an NMR system which employs the present invention.

Referring first to FIG. 1, there is shown the major components of a preferred MRI system which incorporates the present invention. The operation of the system is controlled from an operator console 100 which includes a keyboard and control panel 102 and a display 104. A separate display 98 is also located near the magnet system 103 so that it is available to a physician attending the subject of an MRI scan. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in the magnet system 103 to produce the magnetic field gradients used for position encoding acquired signals. A transceiver module 150 in the system control 122 produces pulses which are amplified by an RF amplifier 151 and coupled to an RF coil in the magnet assembly 103 by a transmit/receive switch 154. The resulting signals radiated by the excited nuclei in the patient may be sensed by the same RF coil and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the RF coil during the transmit mode and to connect the preamplifier 153 during the receive mode.

The NMR signals picked up by the RF imaging coil is digitized by the transceiver module 150 and transferred to a memory module 160 in the system control 122. When an array of k-space data has been acquired in the memory module 160, an array processor 161 operates to Fourier transform the k-space data into an array of image data. This image data is processed as will be described in detail below to produce images on the display 98 as the scan is being performed. In the preferred embodiment a focused ultrasound ablation system 99 is employed to perform a medical procedure while these images are produced.

While a conventional MRI system may be used to implement the invention, in the preferred embodiment an MRI system which is designed to allow access by a physician is employed. Referring particularly to FIG. 1, when an intraoperative MR imaging procedure is conducted a patient is placed in the magnet system 103 and a region of interest in the patient is aligned near the system isocenter located between the two, spaced magnet rings 140 and 142. A physician standing between magnet rings 140 and 142 has unrestricted access to the region of interest in the patient. During the procedure the patient may move, or be moved by the physician. An ultrasonic transducer (not shown) connected to the FUS ablation system 99 may be manipulated by the physician to treat a selected region of the patient and the images produced on display 98 may be used by the physician to help aim the ablation device and to determine when treatment is completed.

Figure 2:
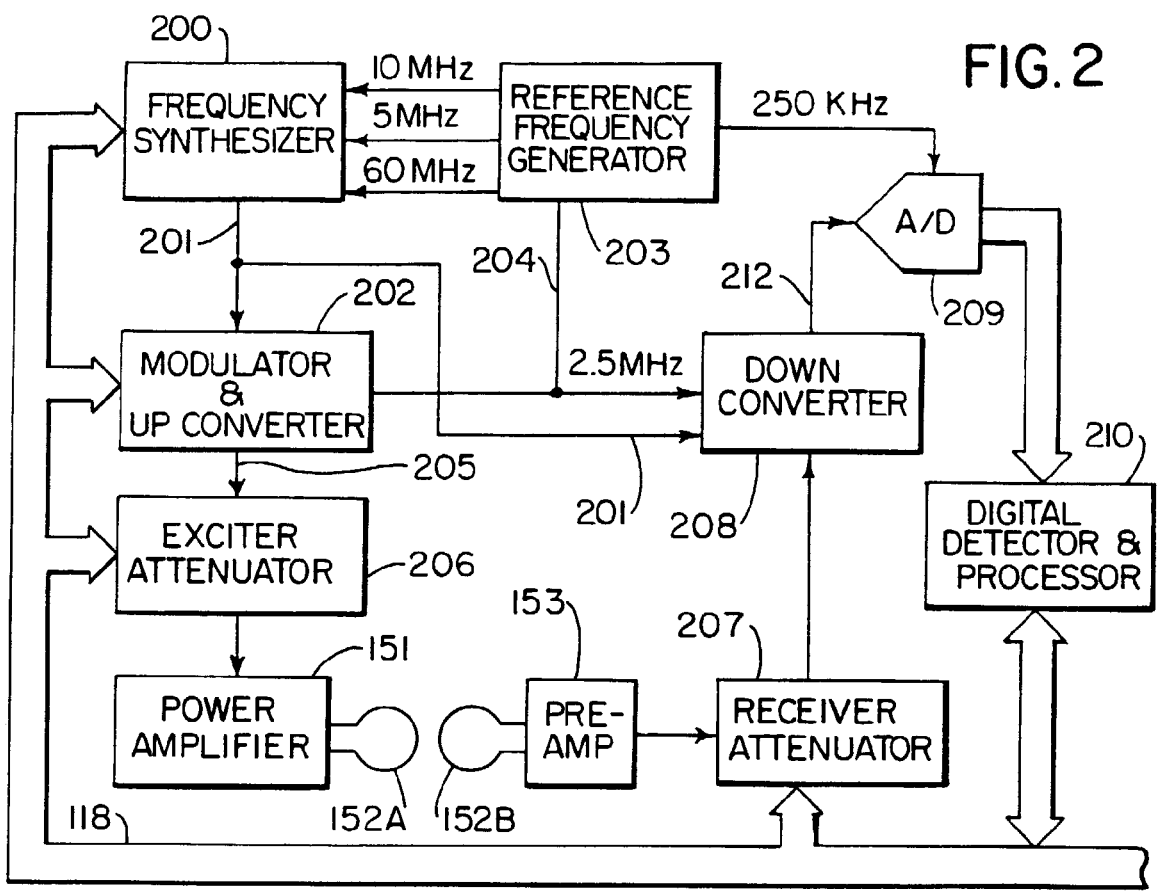
FIG. 2 is an electrical block diagram of the transceiver which forms part of the NMR system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single whole-body coil as shown in FIG. 1. The base, or carrier, frequency of the RF excitation field is produced under control of a frequency synthesizer 2000 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplate 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. These provide a reference phase for the received NMR signals such that the phase is accurately reflected in the I and Q values. For a more detailed description of the receiver, reference is made to U.S. Pat. No. 4,992,736 which is incorporated herein by reference.

To practice the present invention a scan is performed using an imaging pulse sequence, and an image is reconstructed in which the phase information at each image pixel is preserved. A two-dimensional image pulse sequence is employed in the preferred embodiment, and a two-dimensional Fourier transformation is performed on the acquired array of complex signal samples. The phase at each image pixel may be calculated as the argument of the complex value at the pixel $\phi = \tan^{-1} Q/I$. As will be described below, this phase measurement may be used to calculate a phase difference ($\Delta\phi$) at each image pixel which indicates tissue temperatures. In the alternative, the complex difference may be used to produce a temperature map, in which case, the I and Q values at each pixel are used.

Figure 3:
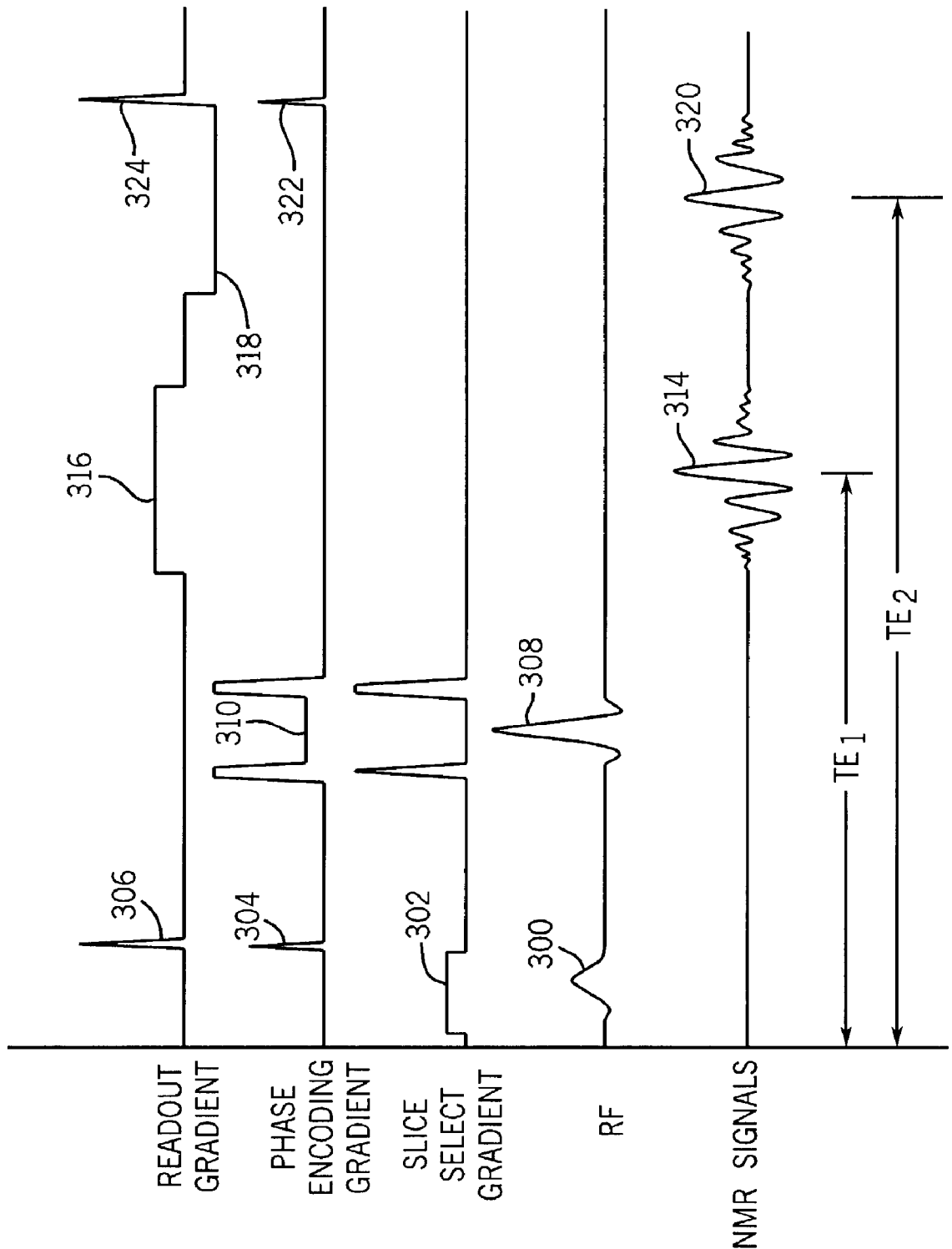
FIG. 3 is a graphic representation of a pulse sequence performed by the NMR system of FIG. 1 to practice the preferred embodiment of the invention.

Referring particularly to FIG. 3, a novel pulse sequence is employed to practice the present invention. It is based on a spin-echo pulse sequence which includes a selective 90° RF excitation pulse 300 which is applied in the presence of a slice select gradient pulse 302 to produce transverse magnetization in a slice of spins of the prescribed thickness and location. A phase encoding pulse 304 is then applied along with a prephasing readout gradient pulse 306. As is well known in the art, this pulse sequence is repeatedly performed and the phase encoding pulse 304 is stepped through a set of values (e.g. 64) in successive pulse sequences to acquire the necessary k-space data to reconstruct an image.

At a time $TE_1/2$ a selective 180° RF refocusing pulse 308 is produced in the presence of a slab select gradient pulse 310. The gradient pulse 310 produces a magnetic field gradient perpendicular to the slice select gradient (i.e., in the phase encoding direction) to begin rephrasing a band of spins in the excited slice. The location and width of this band is set to the prescribed field of view along the phase encoding axis with the result that spins outside this band continue to dephase and do not produce significant NMR signals that might otherwise be aliased into the field of view. At a time $TE_1$ the spins refocus and a spin echo (SPE) NMR signal 314 is produced in the presence of a first readout gradient pulse 316. The first readout gradient pulse 316 frequency encodes the sampled SPE signal 314 for position along the readout axis.

After the first readout pulse 316 is produced a second readout gradient pulse 318 of opposite polarity is produced to generate a gradient-recalled NMR echo signal 320 at the time $TE_2$. The pulse sequence is then completed by producing a rewinder gradient pulse 322 along the phase encoding axis and a rewinder and rewinder gradient pulse 324 along the readout axis to prepare the magnetization for the next pulse sequence to follow.

In the preferred embodiment a 5 mm axial slice in the vicinity of the treatment zone over a 16 cm field of view in the phase encoding direction is imaged. Each image is acquired in 11 seconds as a 256×64 k-space matrix with $TE_1/TE_2/TR=14/24.8/150$ ms.

Figure 4:
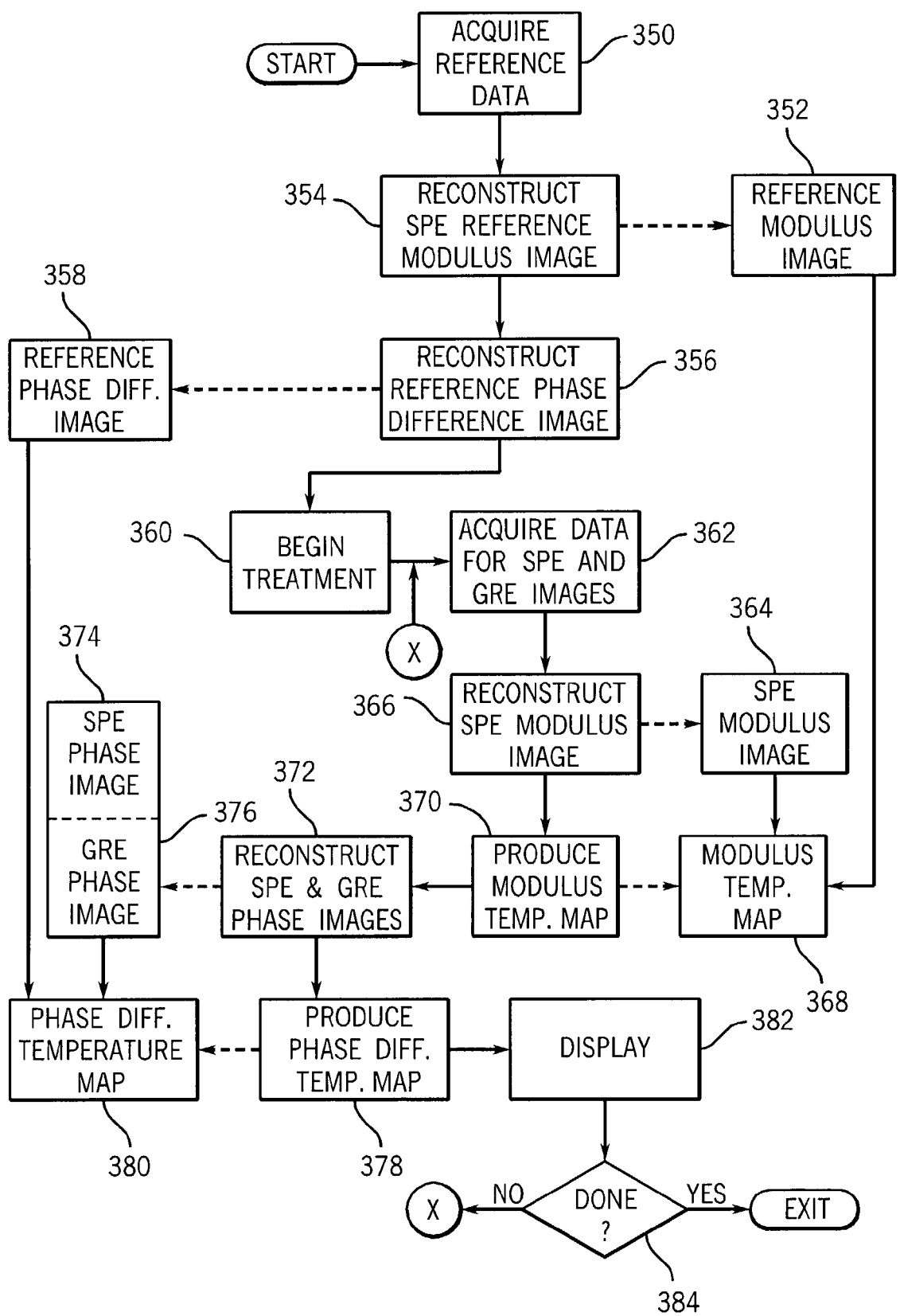
FIG. 4 is a flow chart of the preferred procedure using the present invention.

Referring particularly to FIG. 4, the pulse sequence of FIG. 3 is used to acquire the data needed to carry out the procedure according to the preferred embodiment of the invention. As indicated by process block 350, the first step is to acquire reference images of the tissue to be treated using the pulse sequence of FIG. 3. Using the k-space data set acquired from the SPE NMR signals 314, a reference modulus image 352 is produced as indicated at process block 354. This is done by performing the usual 2D complex Fourier transformation and then calculating the magnitude, or modulus, at each image pixel using the I and Q components of the complex values:

$$M = \sqrt{I^2 + Q^2}.$$

As indicated at process block 356, the next step is to produce a reference phase difference image 358 using both the SPE NMR signals 314 and the GRE NMR signals 320. An SPE phase image $\phi_{SPE}$ is produced first from the complex image previously reconstructed from the SPE signals 314:

$\phi_{SPE} = \tan^{-1} Q/I$.

A complex image is then reconstructed from the k-space data set acquired from the GRE signals 320 by performing a 2D complex Fourier transformation thereon. A GRE phase image $\phi_{GRE}$ is produced from the complex values at each image pixel:

$\phi_{GRE} = \tan^{-1} Q/I$.

The reference phase difference image 358 is then produced by subtracting the two phase images:

$\Delta\phi_{ref} = \phi_{SPE} - \phi_{GRE}$.

This reference phase difference between the two NMR signals is the phase difference that exists before the tissues are treated.

As indicated at process block 360, the treatment process is now begun. In the preferred embodiment a focused ultrasound ablation system manufactured by TxSonics, Inc. of Dallas, Tex. is employed to treat breast tumors. This device must be aimed such that its focal point is located at the tumor, and as will be described in more detail below, this aiming is accomplished by producing modulus temperature maps which indicate where tissue heating is occurring.

A loop is entered in which temperature maps are produced by the MRI system during the treatment procedure. As indicated by process block 362, k-space data is acquired using the pulse sequence of FIG. 3 and an SPE modulus image 364 is produced at process block 366. This is accomplished using the SPE NMR signals 314 in the same manner as described above in process block 354. A modulus temperature map 368 is then produced at process block 370 by subtracting the magnitude at each pixel of the reference modulus image 352 from the magnitude of each corresponding pixel in the SPE modulus image 364. The resulting image is brighter at locations where the temperature has increased due to the insonification. It has been found that the modulus temperature map 368 is indicative of temperature changes in both fat and water, and as a result, provides a clear indication of the location of heating at the ultrasound focal point in fatty tissues such as the human breast. This image 368 is particularly useful for aiming the treatment system.

The next step indicated by process block 372 is to produce two phase images. The first phase image 374 is produced as described above in process block 356 from the acquired SPE NMR signals 314 and the second phase image 376 is reconstructed from the GRE NMR signals 320. As indicated at process block 378, a phase difference temperature map 380 is then produced by first calculating the current phase difference $\Delta\phi_{cur}$ at each corresponding pixel in the phase images 374 and 376:

$$\Delta\phi_{cur} = \phi_{SPE} - \phi_{GRE}.$$

The corrected phase difference $\Delta\phi$ is then calculated at each pixel by subtracting the reference phase difference at corresponding pixels in the phase difference images:

$$\Delta\phi = \Delta\phi_{cur} - \Delta\phi_{ref}.$$

From the corrected phase difference values $\Delta\phi$, the change in temperature $\Delta\delta$ at each pixel is calculated:

$$\Delta\delta = \Delta\phi \times 10^6 / 2\pi\gamma BTE$$

where $\gamma$ = gyromagnetic ratio;
B = MRI system polarization field strength; and
TE = $TE_2 - TE_1$ The phase difference temperature map 380 thus indicates the change in tissue temperature that has occurred at each image pixel since the treatment was started.

The temperature maps may be displayed to the physician in a number of ways as indicated at process block 382. Two separate images may be displayed, one based on the modulus temperature map 368 used to aim the treatment device, and the other based on the phase difference temperature map 380 used to assess the treatment level. In this case temperature at each location in the imaged tissues is indicated by the intensity of the corresponding pixels or their color. Or the information may be combined in a single display in which pixel intensity is governed by the modulus temperature map 368 and pixel color governed by the phase difference temperature map 380. Or, the modulus temperature map 368 may be displayed as a conventional black and white intensity image that depicts where heating is occurring, and the physician may identify particular pixels with a cursor. The temperature change at those pixels is displayed as a number which is based on the temperature change values $\Delta\delta$ at the corresponding pixels in the phase difference temperature map 380.

The system loops back at decision block 384 to acquire and process another set of temperature maps 368 and 380. This continues until the procedure is done. Temperature maps are thus continuously produced during the treatment procedure at a rate of one every 11 seconds to provide a substantially real time indication of the treatment level.

The invention claimed is:

1. A method for monitoring the in vivo treatment of tissues with a magnetic resonance imaging (MRI) system, the steps comprising:
   a) performing a pulse sequence with the MRI system in which a spin-echo (SPE) NMR signal and a gradient-echo (GRE) NMR signal are acquired from the tissues being treated;
   b) repeating step a) to acquire a plurality of said SPE and said GRE NMR signals;
   c) reconstructing an SPE reference modulus image from the acquired plurality of SPE NMR signals, said SPE reference modulus image indicating the magnitude of the SPE NMR signal produced at locations in the tissues being treated;
   d) reconstructing a reference phase difference image from the acquired plurality of SPE and GRE NMR signals, said reference phase difference image indicating the difference in phase between the SPE and GRE NMR signals produced at locations in the tissues being treated;
   e) activating a treatment device aimed at the tissues to be treated to produce a change in temperature therein;
   f) repeating step a) to acquire a plurality of said SPE and said GRE NMR signals;
   g) reconstructing an SPE modulus image from the SPE NMR signals acquired in step f), said SPE modulus image indicating the magnitude of the SPE NMR signal produced at locations in the tissues being treated when step f) is performed;
   h) producing a modulus temperature map from the SPE reference modulus image and the SPE modulus image, said modulus temperature map indicating the temperature change at locations in the tissues being treated;
   i) reconstructing a phase difference image from the SPE and GRE NMR signals acquired in step f), said phase difference image indicating the difference in phase between the SPE and GRE NMR signals produced at locations in the tissues being treated when step f) is performed;
   j) producing a phase difference temperature map from the reference phase difference image and the phase difference image, said phase difference temperature map indicating the temperature change at locations in the tissues being treated; and
   k) displaying the modulus temperature map information and phase difference temperature map information.

2. The method as recited in claim 1 which includes repeating steps f) through k) during the treatment of the tissues to update the display of information in step k) as the treatment is performed.

3. The method as recited in claim 1 in which step k) includes:
   k1) displaying the modulus temperature map as an image indicative of temperature changes at locations in the tissues being treated.

4. The method as recited in claim 3 in which step k) includes:
   k2) displaying the phase difference temperature map as an image indicative of temperature changes at locations in tissues being treated.

5. The method as recited in claim 4 in which the phase difference temperature map image is superimposed on the modulus temperature map image.

6. The method as recited in claim 1 in which performance of the pulse sequence in step a) includes:
   a1) irradiating the tissues with an RF excitation field that produces transverse magnetization in spins in the tissues being treated;
   a2) applying an imaging magnetic field gradient to the spins;
   a3) irradiating the tissues with an RF echo field that inverts the transverse magnetization;
   a4) acquiring the SPE NMR signal while applying a second imaging magnetic field gradient;
   a5) reversing the direction of the second imaging magnetic field gradient; and a6) acquiring the GRE NMR signal while applying the reversed second imaging magnetic field gradient.

7. The method as recited in claim 6 which includes
   applying a slice select magnetic field gradient to the tissues as step a1) is performed to produce transverse magnetization in a selected slice of spins; and
   applying a slab select magnetic field gradient to the tissues as step a3) is performed to invert the transverse magnetization in a selected portion of said slice.

8. The method as recited in claim 1 in which step h) is performed by calculating the difference between magnitudes at corresponding locations in the SPE reference modulus image and the SPE modulus image.

9. The method as recited in claim 1 in which step i) is performed by:
   i1) reconstructing an SPE phase image from the SPE NMR signals acquired in step f);
   i2) reconstructing a GRE phase image from the GRE NMR signals acquired in step f);
   i3) calculating the difference in phase between phase values at corresponding locations in the SPE phase image and the GRE phase image.

10. The method as recited in claim 1 in which step j) includes:
    j1) calculating the difference in phase at corresponding locations in the reference phase difference image and the phase difference image.

11. The method as recited in claim 10 in which step j) further includes:
    j2) converting each calculated phase difference to a temperature change value.

12. A method for producing a temperature map of tissues being treated with a magnetic resonance imaging (MRI) system, the steps comprising:
    a) performing a pulse sequence with the MRI system in which a spin-echo (SPE) NMR signal and a gradient-echo NMR signal are acquired from a subject;
    b) repeating step a) a sufficient number of times to acquire k-space data sets from which images may be reconstructed;
    c) reconstructing an SPE phase image from the k-space data set for the acquired SPE NMR signals;
    d) reconstructing a GRE phase image from the k-space data set for the acquired GRE NMR signals; and
    e) producing a phase difference temperature map by calculating the difference in phase values at corresponding locations in the SPE phase image and the GRE phase image.

13. The method as recited in claim 12 which includes converting each calculated phase difference to a temperature change value.

14. The method as recited in claim 12 in which performance of the pulse sequence in step a) includes:
    a1) irradiating the tissues with an RF excitation field that produces transverse magnetization in spins in the tissues being treated;
    a2) applying an imaging magnetic field gradient to the spins;
    a3) irradiating the tissues with an RF echo field that inverts the transverse magnetization;
    a4) acquiring the SPE NMR signal while applying a second imaging magnetic field gradient;
    a5) reversing the direction of the second imaging magnetic field gradient; and
    a6) acquiring the GRE NMR signal while applying the reversed second imaging magnetic field gradient.

15. The method as recited in claim 14 which includes
    applying a slice select magnetic field gradient which is perpendicular to the slice select magnetic field gradient to the tissues as step a1) is performed to produce transverse magnetization in a selected slice of spins; and
    applying a slab select magnetic field gradient to the tissues as step a3) is performed to invert the transverse magnetization in a selected portion of said slice.

16. The method as recited in claim 12 in which steps a) through e) are performed to produce a reference phase difference temperature map of tissues prior to their treatment;
    in which steps a) through e) are repeated during the treatment of said tissues to produce additional phase difference temperature maps;
    and the phases at locations in the reference phase different map are subtracted from the phases at corresponding locations in said additional phase difference temperature maps.

17. The method as recited in claim 12 in which steps a) through e) are repeated during the treatment of tissues and the resulting phase difference temperature maps are displayed to indicate the changes in temperature at locations in the tissues being treated.

18. The method as recited in claim 17 in which the temperature is indicated by the intensity of pixels at corresponding locations.

19. The method as recited in claim 17 in which the temperature is indicated by the color of pixels at corresponding locations.

* * * * *